US008497580B2

(12) United States Patent
Yang et al.

(10) Patent No.: US 8,497,580 B2
(45) Date of Patent: Jul. 30, 2013

(54) NOBLE METAL CAP FOR INTERCONNECT STRUCTURES

(75) Inventors: Chih-Chao Yang, Glenmont, NY (US); Daniel C. Edelstein, White Plains, NY (US); Fenton R. McFeely, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 13 days.

(21) Appl. No.: 13/191,090

(22) Filed: Jul. 26, 2011

(65) Prior Publication Data

US 2011/0285021 A1 Nov. 24, 2011

Related U.S. Application Data

(62) Division of application No. 12/021,316, filed on Jan. 29, 2008, now Pat. No. 7,998,664.

(51) Int. Cl.
*H01L 23/48* (2006.01)
*H01L 23/52* (2006.01)

(52) U.S. Cl.
USPC .......................................... 257/762; 257/768

(58) Field of Classification Search
USPC ................. 257/741, 762, 768, 769, E21.575, 257/E23.162
See application file for complete search history.

(56) References Cited

U.S. PATENT DOCUMENTS

| | | | | |
|---|---|---|---|---|
| 5,585,673 | A | 12/1996 | Joshi et al. | |
| 5,695,810 | A | 12/1997 | Dubin et al. | |
| 6,323,554 | B1 | 11/2001 | Joshi et al. | |
| 6,342,733 | B1 | 1/2002 | Hu et al. | |
| 6,706,625 | B1 | 3/2004 | Sudijono et al. | |
| 6,881,437 | B2 * | 4/2005 | Ivanov et al. | 438/676 |
| 7,084,060 | B1 | 8/2006 | Furukawa et al. | |
| 7,105,445 | B2 | 9/2006 | Wong et al. | |

(Continued)

FOREIGN PATENT DOCUMENTS

| | | |
|---|---|---|
| WO | WO2007003223 A1 | 1/2007 |
| WO | 2007066277 | 6/2007 |

OTHER PUBLICATIONS

European Search Report, Jun. 27, 2012.

(Continued)

*Primary Examiner* — Hung Vu
(74) *Attorney, Agent, or Firm* — Scully, Scott, Murphy & Presser, P.C.; Katherine S. Brown, Esq.

(57) ABSTRACT

An interconnect structure that includes a dielectric material having a dielectric constant of about 3.0 or less is provided. This low k dielectric material has at least one conductive material having an upper surface embedded therein. The dielectric material also has a surface layer that is made hydrophobic prior to the formation of the noble metal cap. The noble metal cap is located directly on the upper surface of the at least one conductive material. Because of the presence of the hydrophobic surface layer on the dielectric material, the noble metal cap does not substantially extend onto the hydrophobic surface layer of the dielectric material that is adjacent to the at least one conductive material and no metal residues from the noble metal cap deposition form on this hydrophobic dielectric surface.

20 Claims, 5 Drawing Sheets

U.S. PATENT DOCUMENTS

| | | | | |
|---|---|---|---|---|
| 2004/0113279 | A1 | 6/2004 | Chen et al. | |
| 2005/0085031 | A1 | 4/2005 | Lopatin et al. | |
| 2006/0113675 | A1 | 6/2006 | Chang et al. | |
| 2006/0121733 | A1* | 6/2006 | Kilpela et al. | 438/681 |
| 2006/0189133 | A1 | 8/2006 | Dimitrakopoulos et al. | |
| 2007/0077750 | A1 | 4/2007 | Ma et al. | |
| 2008/0315426 | A1 | 12/2008 | Yang et al. | |

OTHER PUBLICATIONS

Liu, et al., "Improvement of Post-Chemical Mechanical Planarization Characteristics on Organic Low k Methylsilsesquioxane as Intermetal Dielectric", J. Electrochem. Soc, vol. 147, No. 11, pp. 4314-4317.

International Search Report dated Mar. 12, 2009.

* cited by examiner

NOBLE METAL CAP FOR INTERCONNECT STRUCTURES

CROSS REFERENCE TO RELATED APPLICATION

This application is a divisional of U.S. patent application Ser. No. 12/021,316, filed Jan. 29, 2008 the entire content and disclosure of which is incorporated herein by reference.

FIELD OF THE INVENTION

The present invention relates to a semiconductor interconnect structure, and a method of fabricating the same. More particularly, the present invention relates to a semiconductor interconnect structure having enhanced electromigration (EM) reliability in which the selectivity of the noble metal cap to a surface of a conductive material that is embedded within a low dielectric constant k dielectric material is enhanced.

BACKGROUND OF THE INVENTION

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

In semiconductor interconnect structures, electromigration (EM) has been identified as one metal failure mechanism. EM is one of the worst reliability concerns for very large scale integrated (VLSI) circuits and manufacturing since the 1960's. The problem not only needs to be overcome during the process development period in order to qualify the process, but it also persists through the lifetime of the chip. Voids are created inside the metal conductors of an interconnect structure due to metal ion movement caused by the high density of current flow.

Although the fast diffusion path in metal interconnects varies depending on the overall integration scheme and materials used for chip fabrication, it has been observed that metal atoms, such as Cu atoms, transported along the metal/post planarized dielectric cap interface play an important role on the EM lifetime projection. The EM initial voids first nucleate at the metal/dielectric cap interface and then grow in the direction to the bottom of the interconnect, which eventually results in a circuit dead opening.

FIGS. 1A-1D are pictorial representations of a prior art interconnect structure at various stages of an EM failure. In these drawings, reference numeral 12 denotes the dielectric cap, and reference numeral 10 denotes the metal interconnect feature; all other components of the prior art interconnect structure are not labeled to avoid obscuring the EM problem.

FIG. 1A is at an initial stress stage. FIG. 1B is at a time when void 14 nucleation initiates at the metal interconnect feature 10/dielectric cap 12 interface. FIG. 1C is at a time when the void 14 grows towards the bottom of the conductive feature 10, and FIG. 1D is at a time in which the void 14 growth crosses the metal interconnect feature 10 causing a circuit dead opening.

It has been demonstrated that by replacing the Cu/dielectric interface with a Cu/metal interface can enhance electromigration resistance by greater than 100×. Prior art metal caps are typically comprised of a Co-containing alloy such as, for example, CoWP, which is selectively deposited atop of the Cu conductor region of the interconnect structure. One problem with utilizing such selective deposited metal caps is that some of the metal cap extends onto the adjoining surface of the interconnect dielectric material and, as such, electrical shorts between adjacent interconnects may arise. This is seen, for example, in FIG. 2 wherein reference numeral 20 denotes a dielectric material, reference numeral 22 denotes a conductive material embedded within the dielectric material 20, reference numeral 24 denotes a Co-containing alloy metal cap, and reference numeral 25 denotes metal residues from the Co-containing alloy cap process.

In addition to the above, it is known to provide a metal cap directly on the surface of an interconnect conductive material, such as, for example, Cu, by recessing the interconnect conductive material below a surface of the interconnect dielectric material. Such a structure is shown, for example, in FIG. 3. In this figure, reference numeral 20 denotes the interconnect dielectric material, reference numeral 22 denotes the interconnect conductive material embedded within the dielectric material 20, reference numeral 23 denotes a dielectric cap, and reference numeral 24 denotes the metal cap. Although this prior art recess process provides a metal cap that is located only on a surface of the recessed conductive material, such a process is problematic since there is high process cost associated therewith.

It is also worth mentioning that during a clean in dilute hydrofluoric acid, which is generally used to clean the surface of the interconnect dielectric material, corrosion of metal caps may occur. This is particularly observed when CoWP is used as the metal cap material.

In view of the above, there is a need for providing an interconnect structure which avoids a circuit dead opening caused by EM failure as well as electrical shorts between adjacent interconnect structures which are typically exhibited when prior art selectively deposited Co-containing metal caps are employed.

SUMMARY OF THE INVENTION

The present invention provides a circuit interconnect structure that has improved EM reliability. The present invention also provides an interconnect structure in which electrical shorts between adjacent interconnect structures is avoided. The present invention also provides an interconnect structure that has better reliability and technology extendibility for the semiconductor industry.

In particular, the present invention provides an interconnect structure in which a noble metal-containing cap layer is present directly on a non-recessed surface of a conductive material which is embedded within a low k dielectric material. The term "low k" is used throughout this application to denote an interconnect dielectric material having a dielectric constant of about 3.0 or less. Applicants have determined that by forming a hydrophobic surface layer within an exposed surface of a low k dielectric material prior to metal cap formation provides a means for controlling the selective formation of the metal cap directly on the non-recessed surface of a conductive material. That is, the selective formation of the metal cap directly on the non-recessed surface of a conductive material is enhanced since the formation rate of the metal cap on the non-recessed surface of a conductive material is greater than on the hydrophobic surface layer of the low k dielectric material.

In general terms, the interconnect structure of the present invention comprises:

a dielectric material having a dielectric constant of about 3.0 or less, said dielectric material having a hydrophobic surface layer and at least one conductive material having an upper surface embedded within said dielectric material; and a noble metal cap located directly on said upper surface of said at least one conductive material, said noble metal cap does not substantially extend onto said hydrophobic surface layer of said dielectric material that is adjacent to said at least one conductive material and no noble metal residues are present on the hydrophobic surface layer of said dielectric material.

The phrase "substantially does not extend" is used in the present invention to denote that no or minimal net noble metal noble metal is deposited on the low k dielectric material because of the presence of the hydrophobic surface layer. The minimal extension of the noble metal cap onto the hydrophobic surface layer is less than 5Å. Also, there is no "residues" from the noble metal cap deposition on the hydrophobic surface layer. By "residues" it is meant that no fragments of noble metal material form on the dielectric material surface.

The dielectric material which is present in the inventive interconnect structure may be any interconnect dielectric material having a dielectric constant of about 3.0 or less. Illustratively, the dielectric material employed in the present invention comprises a silsesquioxane, a C doped oxide (i.e., an organosilicate) that includes at least atoms of Si, C, O and H, a thermosetting polyarylene ether, or multilayers thereof. The dielectric material may be porous, non-porous or contain regions and/or surfaces that are porous and other regions and/or surfaces that are non-porous.

The hydrophobic surface layer that is present within the dielectric material is formed in the present invention by treating the dielectric material with a hydrogen-containing plasma or, more preferably by thermal treatment in a hydrogen-containing ambient. The hydrophobic surface layer has a depth, as measured from the top surface of the dielectric material into the interior of the dielectric material, of about 2 nm or less. Typically, the hydrophobic surface layer has a depth from about 1 to about 0.2 nm into the interior of the dielectric material.

The conductive material which forms an embedded conductive region within the interconnect structure includes any material that has the ability to transfer electricity. Examples of conductive material that can be present in the conductive region include, for example, polySi, a conductive metal, a conductive metal alloy, a conductive metal silicide or combinations and multilayers thereof. In one embodiment of the present invention, the conductive material includes a conductive metal such as, for example, Cu, W, and/or Al. In a highly preferred embodiment of the present invention, the conductive material includes a Cu-containing conductive material such as, for example, Cu, or a Cu alloy (such as AlCu).

The conductive material is typically separated from the dielectric material by a diffusion barrier. The diffusion barrier prevents diffusion of the conductive material into the dielectric material. Examples of diffusion barriers that can be present within the conductive region include, for example, Ta, TaN, Ti, TiN, Ru, RuN, RuTa, RuTaN, IrTa, IrTaN, W, WN or combinations and multilayers thereof.

The conductive material may be present within a via opening, a line opening, a combined via and line opening or any combination thereof.

The term "noble metal" when referring to the cap located atop the at least one conductive material includes any metal that is resistant to corrosion or oxidation. The preferred noble metals that can be used in the present invention are selected from the group consisting of Ru, Ir, Rh, Pt and alloys thereof. More preferably, the noble metal employed as the noble metal cap comprises Ru or a Ru alloy.

In the present invention, the upper surface of the at least one conductive material is substantially coplanar with the hydrophobic surface layer of the interconnect dielectric material. That is, the present invention provides structures in which the conductive material is non-recessed.

In addition to the interconnect structure mentioned above, the present invention also provides a method of fabricating the same. With respect to the inventive method, the applicants have determined that improved selectivity of noble deposition onto the conductive material instead of the dielectric material can be obtained if the dielectric material including the embedded conductive material is treated to form a hydrophobic surface layer prior to the formation of the noble metal cap. The hydrophobic surface layer can be formed by treating the dielectric material with a hydrogen-containing plasma or, more preferably by thermal treatment in a hydrogen-containing ambient.

In general terms, the inventive method includes:

providing a dielectric material having a dielectric constant of about 3.0 or less, said dielectric material having at least one conductive material having an upper surface embedded within said dielectric material;

forming a hydrophobic surface layer within exposed surfaces of the dielectric material; and forming a noble metal cap directly on said upper surface of said at least one conductive material, said noble metal cap does not substantially extend onto said hydrophobic surface layer that is adjacent to said at least one conductive material, said noble metal cap forming does not result in noble metal residues on the hydrophobic surface layer.

DETAILED DESCRIPTION OF THE INVENTION

Figure 1A:
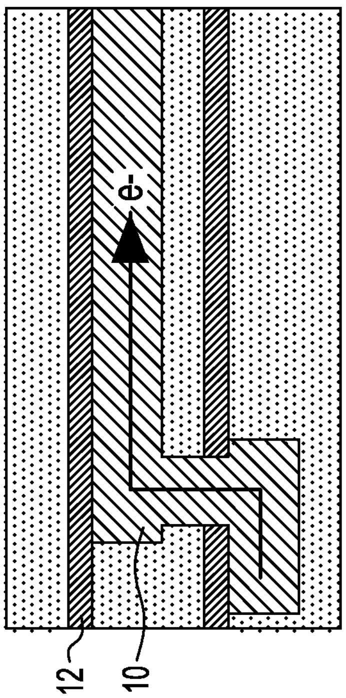
FIGS. 1A-1D are pictorial representations (through cross sectional views) illustrating the formation of a circuit dead opening in a prior art interconnect structure which is caused by EM failure.
Figure 1B:
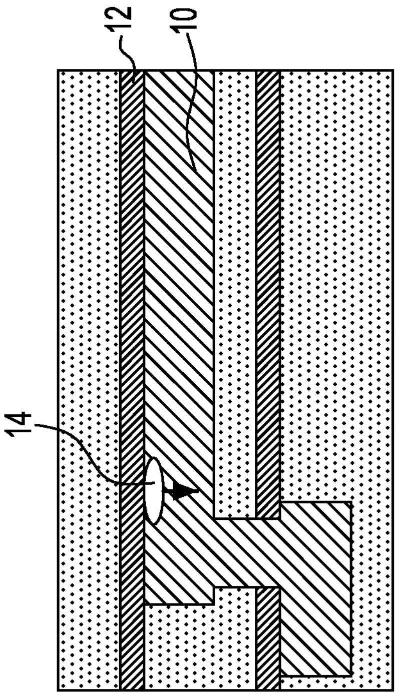
Figure 1C:
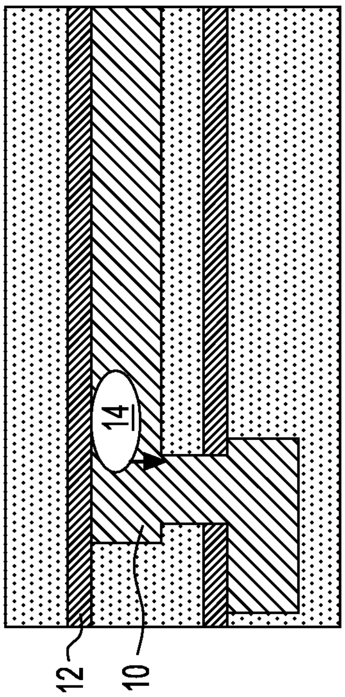
Figure 1D:
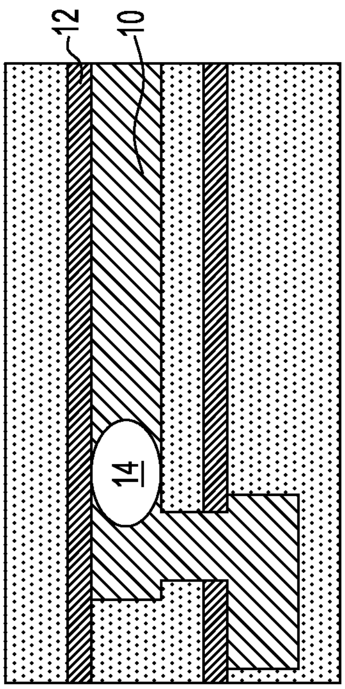
Figure 2:
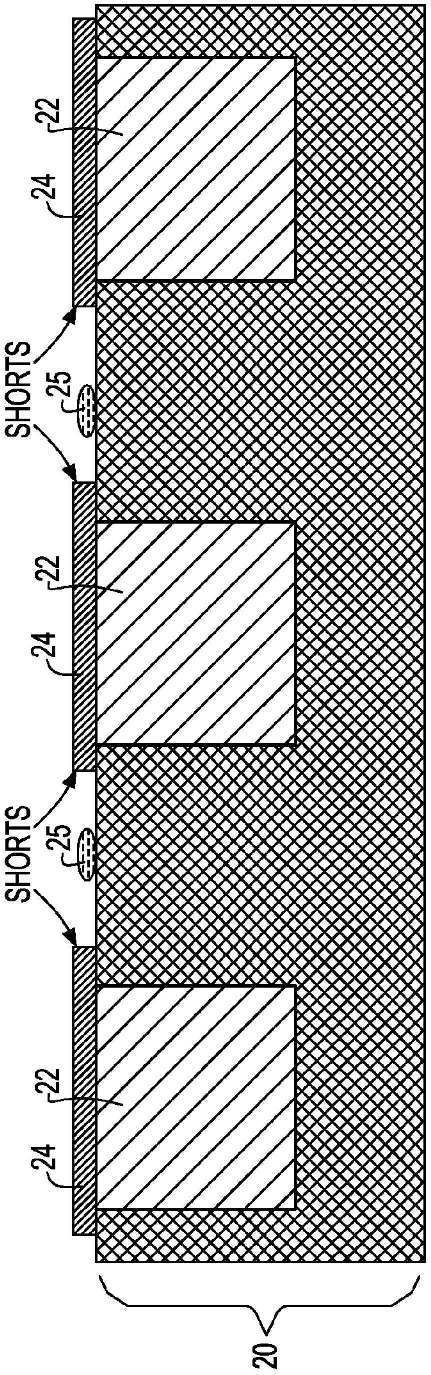
FIG. 2 is a prior art interconnect structure including a Co-containing alloy metal cap located atop a conductive material that is embedded with a dielectric material, and metal residues from the Co-containing alloy cap process are present on the dielectric surface.
Figure 3:
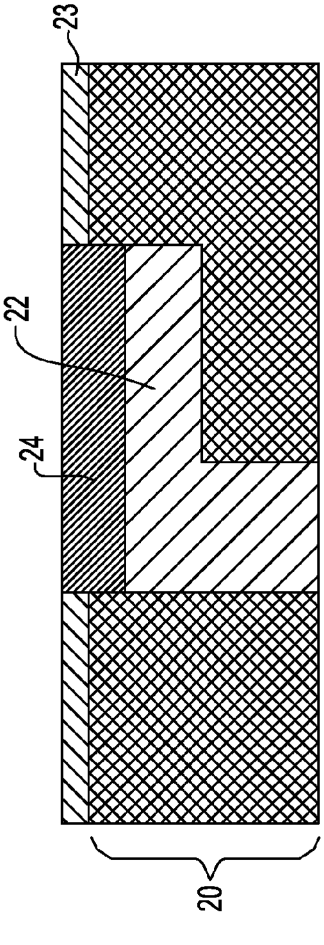
FIG. 3 is a pictorial representation of a prior art interconnect structure including a recessed conductive material embedded within a dielectric material.

The present invention, which provides an interconnect structure having enhanced electromigration (EM) reliability without degrading circuit short yield and a method of forming the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present invention provides an interconnect structure that includes a dielectric material having a dielectric constant of about 3.0 or less. This low k dielectric material has at least one conductive material having an upper surface embedded therein. The dielectric material also has a surface layer that is made hydrophobic prior to the formation of the noble metal cap. The noble metal cap is located directly on the upper surface of the at least one conductive material. Because of the presence of the hydrophobic surface layer within the dielectric material, the noble metal cap does not substantially extend onto the hydrophobic surface layer that is adjacent to the at least one conductive material and no metal residues from the noble metal cap deposition form on this hydrophobic dielectric surface.

The present also provides a method of fabricating such an interconnect structure in which exposed surfaces of a dielectric material including at least one conductive material embedded therein are made hydrophobic prior to the formation of the noble metal cap. The hydrophobic surface layer within the dielectric material is achieved in the present invention by treating the dielectric material with a hydrogen-containing plasma or, more preferably by thermal treatment in a hydrogen-containing ambient. Such a treatment occurs after formation of the at least one conductive material embedded within the dielectric material, but prior to the formation of the noble metal cap.

Figure 4A:
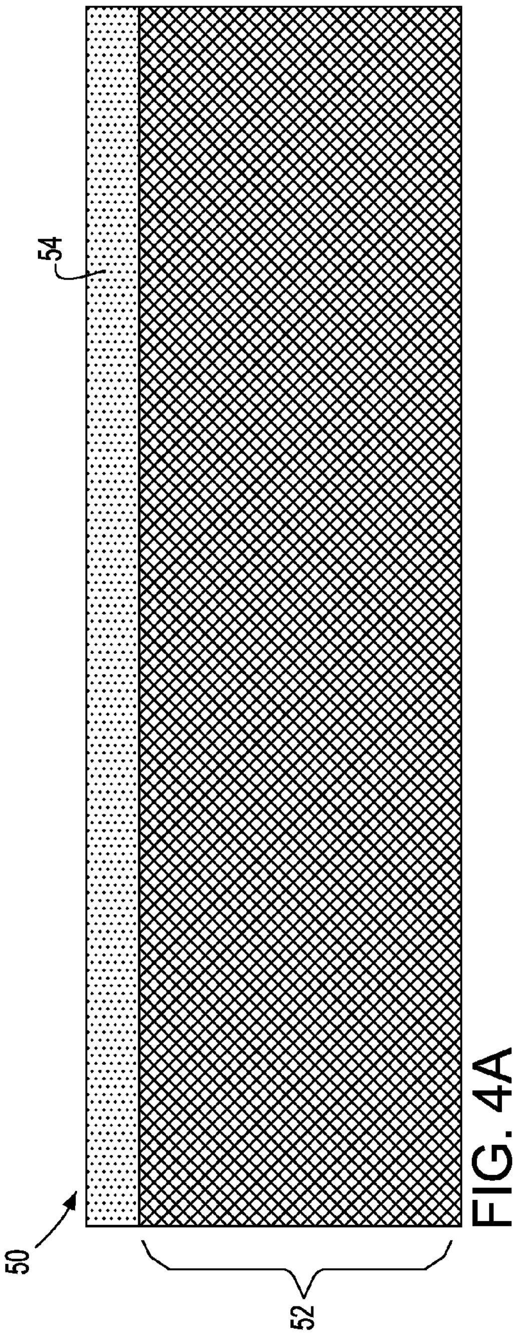
FIGS. 4A-4F illustrate an interconnect structure through various processing steps of the present invention.
Figure 4B:
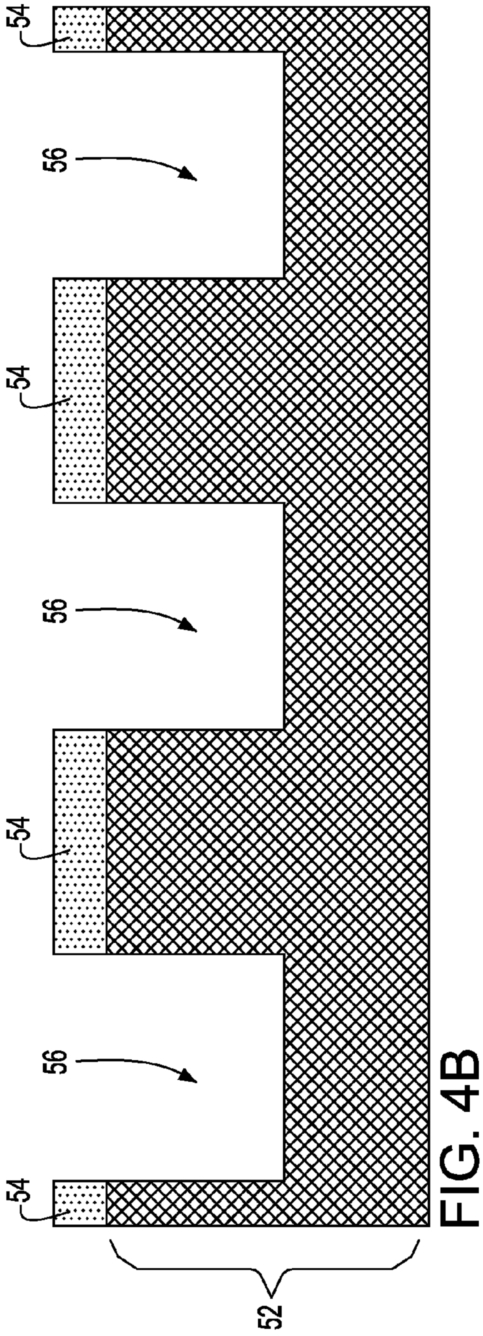

Reference is now made to FIGS. 4A-4F which are pictorial representations (through cross sectional views) illustrating one exemplary interconnect structure of the present invention through various processing steps. Specifically, FIG. 4A illustrates an initial structure 50 that can be employed in the present invention in fabricating the inventive interconnect structure. The initial structure 50 includes a dielectric material 52 having a pad stack 54 located on an upper surface thereof.

It is noted that the initial structure 50 is typically located upon a substrate (not shown in the drawings of the present application). The substrate may comprise a semiconducting material, an insulating material, a conductive material or any combination including multilayers thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

When the substrate comprises a combination of an insulating material and a conductive material, the substrate may represent a first interconnect level of a multilayered interconnect structure.

The dielectric material 52 of the initial structure 50 comprises any interlevel or intralevel dielectric including inorganic dielectrics or organic dielectrics. The dielectric material 52 may be porous, non-porous or contain regions and/or surfaces that are porous and other regions and/or surfaces that may be non-porous. Some examples of suitable dielectrics that can be used as the dielectric material 52 include, but are not limited to: silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The dielectric material 52 typically has a dielectric constant that is about 3.0 or less, with a dielectric constant of about 2.8 or less being even more typical. All dielectric constants mentioned herein are relative to a vacuum, unless otherwise noted. These dielectrics generally have a lower parasitic cross talk as compared with dielectric materials that have a higher dielectric constant than 4.0. The thickness of the dielectric material 52 may vary depending upon the dielectric material used as well as the exact number of dielectric layers within the dielectric material 52. Typically, and for normal interconnect structures, the dielectric material 52 has a thickness from about 50 to about 1000 nm.

The dielectric material 52 is formed utilizing any conventional deposition process including, but not limited to: chemical vapor deposition (CVD), plasma enhanced chemical vapor deposition (PECVD), evaporation, chemical solution deposition and spin-on coating.

After forming the dielectric material 52, pad stack 54 is formed on an exposed upper surface of dielectric material 52. The pad stack 54 comprises an oxide, nitride, oxynitride or multilayers thereof (e.g., a pad stack comprising a pad oxide and a pad nitride). The pad stack 54 typically comprises a semiconductor oxide, semiconductor nitride and/or a semiconductor oxynitride. Preferably, the pad stack 54 comprises an oxide of silicon and/or a nitride of silicon.

In some embodiments, the pad stack 54 may be formed utilizing any conventional deposition process including, for example, CVD, PECVD, evaporation, chemical solution deposition, physical vapor deposition (PVD) and atomic layer deposition. In other embodiments, the pad stack 54 is formed by a thermal process such as, for example, a thermal oxidation, a thermal nitridation and/or a thermal oxynitridation process. In yet other embodiments, the pad stack 54 is formed utilizing a combination of deposition and thermal processes.

The thickness of the pad stack 54 may vary depending on the number of materials within the pad stack itself as well as the technique that was used in forming the same. Typically, the pad stack 54 has a thickness from about 10 to about 80 nm.

After forming the initial structure 50 shown in FIG. 4A, at least one opening 56 is formed into the dielectric material 52 utilizing the pad stack 54 as a pattern mask. The resultant structure including the at least one opening 56 is shown, for example, in FIG. 4B. The at least one opening 56 may include a via opening, a line opening, a combined via and line opening, or any combinations thereof. In the drawings, three line openings are shown by way of a non-limiting example.

The at least one opening 56 is formed utilizing conventional lithography and etching. The lithographic step includes forming a photoresist (organic, inorganic or hybrid) atop the pad stack 54 utilizing a conventional deposition process such as, for example, CVD, PECVD and spin-on coating. Following formation of the photoresist, the photoresist is exposed to a desired pattern of radiation. Next, the exposed photoresist is developed utilizing a conventional resist development process.

After the development step, an etching step is performed to transfer the pattern from the patterned photoresist into first the pad stack 54 and then the dielectric material 52. The patterned photoresist is typically removed from the surface of the structure after transferring the pattern into the pad stack 54 utilizing a conventional resist stripping process such as, for example, ashing. The etching step used in forming the at least one opening 56 comprises a dry etching process (including reactive ion etching, ion beam etching, plasma etching or laser ablation), a wet chemical etching process or any combination thereof. Typically, reactive ion etching is used to form the at least one opening 56.

Figure 4C:
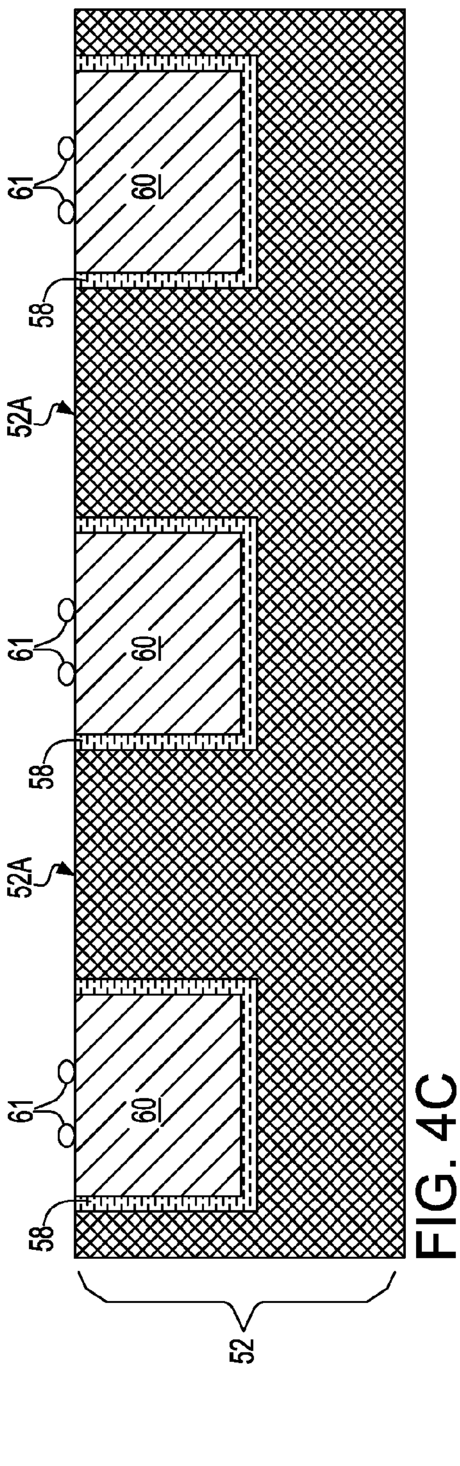

Next, and as shown in FIG. 4C, a diffusion barrier 58 and a conductive material 60 are formed into each of the at least one openings 56. The diffusion barrier 58 comprises Ta, TaN, Ti, TiN, Ru, RuN, RuTa, RuTaN, IrTa, IrTaN, W, WN or any other material that can serve as a barrier to prevent conductive material from diffusing there through. The thickness of the diffusion barrier 58 may vary depending on the deposition process used as well as the material employed. Typically, the diffusion barrier 58 has a thickness from about 4 to about 40 nm, with a thickness from about 7 to about 20 nm being more typical.

The diffusion barrier 58, which is located between the conductive material 60 and the dielectric material 52 is formed by any conventional deposition process including, for example, ALD, PEALD, CVD, PECVD, PVD, sputtering and plating.

The conductive material 60 used in forming the conductive region of the interconnect structure includes, for example, polySi, a conductive metal, an alloy comprising at least one conductive metal, a conductive metal silicide or combinations thereof. Preferably, the conductive material 60 that is used in forming the conductive region is a conductive metal such as Cu, W or Al, with Cu or a Cu alloy (such as AlCu) being highly preferred in the present invention.

The conductive material 60 is formed into each of the openings 56 that are lined with the diffusion barrier 58 utilizing any conventional deposition process including, for example, CVD, PECVD, PVD, sputtering, plating, chemical solution deposition and electroless plating. After deposition of the conductive material 60, the structure is subjected to a planarization process such as, for example, chemical mechanical polishing (CMP) and/or grinding. The planarization process provides a planar structure such as is shown in FIG. 4C in which the upper surfaces of the dielectric material 52, the diffusion barrier 58 and the conductive material 60 are substantially coplanar with each other. It is noted that during the planarization process, the remaining pad stack 54 is removed from the structure.

In some embodiments of the invention, and as shown in FIG. 4C, oxide and organic particles, which are resulted from CMP slurry, denoted as reference numeral 61 can be formed on the surface of the conductive material. The presence of oxide and organic particles 61 is undesirable in an interconnect structure since the same may degrade the adhesion between conductive material 60 and the capping layer 62, FIG. 4E. Good adhesion between the conductive material 60 and the capping layer 62 is required for good electromigration resistance. More important, the presence of oxide and organic particles 61 are undesirable in an interconnect structure since the same may degrade the selectivity of noble cap deposition between the conductive material 60 surface and the dielectric material 52 surface. For improved selectivity, a clean conductive material 60 surface is required.

It is also worth mentioning that the surface (designed by reference numeral 52A) of the dielectric material 52 is hydrophilic at this point of the present invention.

Figure 4D:
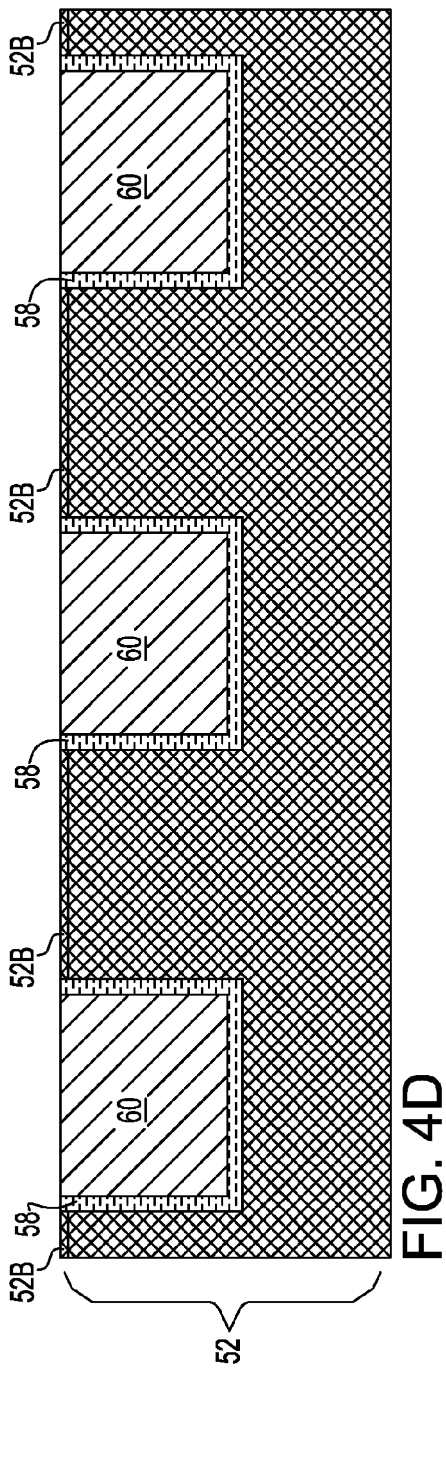

Next, and as shown in FIG. 4D, the oxide and organic particles 61 can be removed from the surface of the conductive material 60 at the same time as creating a hydrophobic surface layer 52B within the exposed portions of the dielectric material 52 not including conductive material 60 or diffusion barrier 58. The hydrophobic surface layer 52B that is present in the dielectric material 52 is formed in the present invention by treating the dielectric material 52 with a hydrogen-containing plasma or, more preferably by thermal treatment in a hydrogen-containing ambient. Details concerning each of these treatments will be provided herein below. The hydrophobic surface layer 52B has a depth as measured from the top surface of the dielectric material 52 into the interior of the dielectric material, of about 2 nm or less. Typically, the hydrophobic surface layer 52B has a depth from about 1 to about 0.2 nm into the interior of the dielectric material.

When a hydrogen-containing plasma is employed in the present invention to form the hydrophobic surface layer in the dielectric layer, any hydrogen-containing source can be used in generating a plasma including hydrogen. Examples of such hydrogen-containing sources include, but are not limited to $NH_3$ and $H_2$. The hydrogen-containing source may be used alone or admixed with an inert gas such as, for example, He, Ar, Ne and mixtures thereof. As such, the hydrogen-containing plasma may contain a plasma including 100% hydrogen or the hydrogen content in the plasma may be in a range from about 2% up to 100% hydrogen. When an admixture of a hydrogen-containing source and an inert gas is employed in generating the plasma, the hydrogen is preferably contained in an amount of from about 2% to about 90%, with a hydrogen content of from about 20% to about 70% being more typical. The hydrogen-containing plasma is generated utilizing any conventional method (and/or apparatus) that is capable of generating a plasma.

Plasma treatment is performed at a temperature from about 100 to about 450° C., with a temperature from about 150 to about 300° C. being more preferred. The duration of plasma treatment may vary depending on the dielectric material being treated. Typically, plasma treatment is performed for a time period from about 10 seconds to about 5 minutes, with a duration of plasma treatment from about 30 seconds to about 2 minutes being more preferred.

When thermal treating is used in generating the hydrophobic surface layer within the dielectric material, any hydrogen-containing source can be used. Examples of such hydrogen-containing sources include, but are not limited to $NH_3$ and $H_2$. The hydrogen-containing source may be used alone or admixed with an inert gas such as, for example, He, Ar, Ne and mixtures thereof. As such, the hydrogen-containing ambient may contain 100% hydrogen or the hydrogen may be in a range from about 2% up to 100% hydrogen. When an admixture of a hydrogen-containing source and an inert gas is employed, the hydrogen is preferably contained in an amount of from about 2% to about 90%, with a hydrogen content of from about 20% to about 70% being more typical.

Thermal treating in a hydrogen-containing treatment is performed at a temperature from about 100 to about 450° C., with a temperature from about 150 to about 300° C. being more preferred. The duration of thermal treatment may vary depending on the dielectric material being treated. Typically, thermal treatment in a hydrogen-containing ambient is performed for a time period from about 10 seconds to about 5 minutes, with a duration of thermal treatment from about 30 seconds to about 2 minutes being more preferred.

Figure 4E:
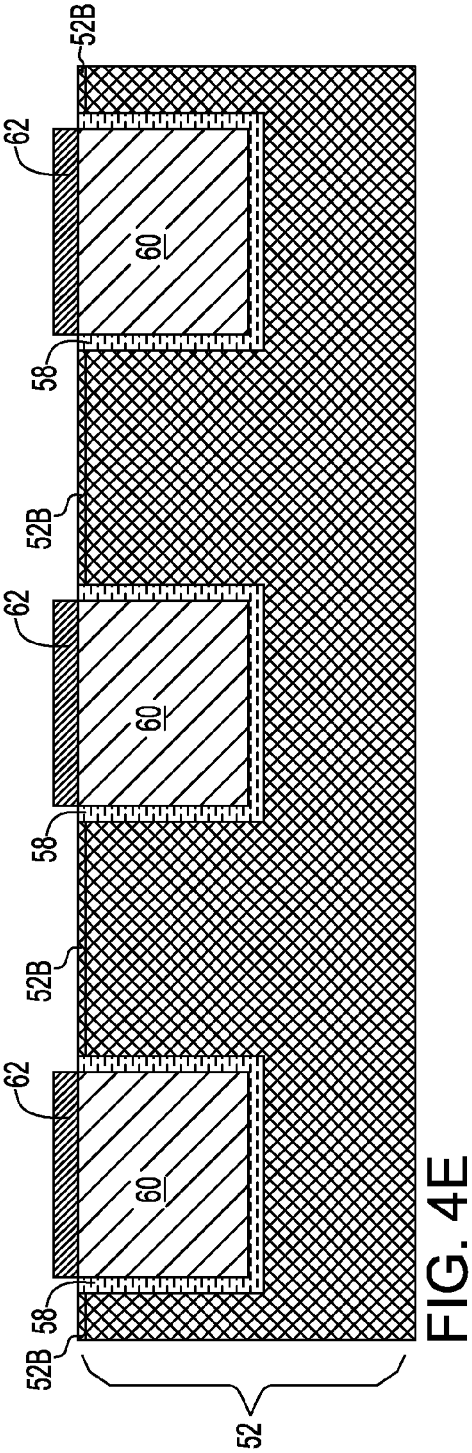
Figure 4F:
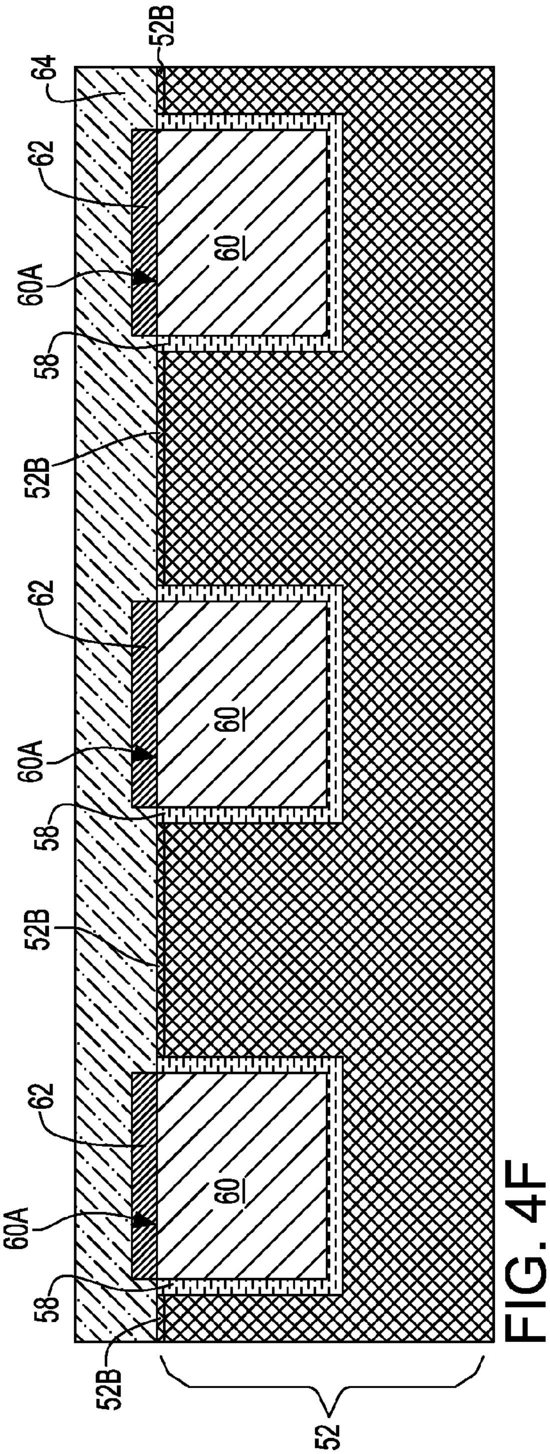

Next, and as is shown in FIG. 4E, a noble metal cap 62 is selectively formed atop the conductive material 60; some of the noble metal cap 62 may extend onto the surface of the diffusion barrier 58, but little or none of the noble metal cap 62 extends onto the hydrophobic surface layer 52B of the dielectric material 52 that is laterally adjacent to said conductive material 60. None of the noble metal cap 62 (or residues thereof) are deposited (or form) on the dielectric material 52 surface.

The term "noble metal" when referring to the cap 62 located atop the at least one conductive region (i.e., conductive material 60) includes any metal that is resistant to corrosion or oxidation. The preferred noble metals that can be used in the present invention are selected from the group consisting of Ru, Ir, Rh, Pt and alloys thereof. More preferably, the noble metal employed as the noble metal cap comprises Ru or a Ru alloy. In some embodiments, the noble metal cap 62 is comprised of a multilayered noble metal or noble metal alloy stack.

The thickness of the noble metal cap 62 may vary depending on the type of noble metal present in the cap, the deposition technique and conditions used as well as the number of noble metals within the cap. Typically, the noble metal cap 62 has a thickness from about 1 to about 100 Å, with a thickness from about 5 to about 50 Å being more highly preferred.

The noble metal cap 62 is formed utilizing a low temperature deposition process including, for example, CVD, PECVD, low pressure CVD and ALD. By "low temperature", it is meant a deposition temperature of about 300° C. or less, with a deposition temperature between 150° C. and 250° C. being even more preferred.

After selectively forming the noble metal cap 62 onto conductive material 60, a dielectric capping layer 64 is formed across the entire structure shown in FIG. 4E. The resultant structure including the dielectric capping layer 64 is shown, for example, in FIG. 4F. The dielectric capping layer 64 comprises any suitable dielectric capping material such as, for example, SiC, $Si_4NH_3$, $SiO_2$, a carbon doped oxide, a nitrogen and hydrogen doped silicon carbide SiC(N,H) or multilayers thereof.

The thickness of the dielectric capping layer 64 may vary depending on the technique used to form the same as well as the material make-up of the layer. Typically, the dielectric capping layer 64 has a thickness from about 15 to about 100 nm, with a thickness from about 25 to about 45 nm being more typical.

The dielectric capping layer 64 is formed utilizing any conventional deposition process including, for example, CVD, PECVD, evaporation, spin-on coating, chemical solution deposition and PVD.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An interconnect structure comprising:

a dielectric material having a dielectric constant of about 3.0 or less, said dielectric material having a hydrophobic surface layer and at least one conductive material having an upper surface embedded within said dielectric material, wherein the upper surface of said at least one conductive material is coplanar with an upper surface of said hydrophobic surface layer of said dielectric material; and a noble metal cap selected from the group consisting of Ru, Ir, Rh, Pt and alloys thereof located directly on said upper surface of said at least one conductive material, said noble metal cap does not substantially extend onto said hydrophobic surface layer of said dielectric material that is adjacent to said at least one conductive material and no noble metal residues are present on the hydrophobic surface layer of said dielectric material.

2. The interconnect structure of claim 1 wherein said noble metal cap is selected from the group consisting of Ir, Rh, Pt and alloys thereof.

3. The interconnect structure of claim 1 wherein said noble metal cap comprises Ru or a Ru alloy.

4. The interconnect structure of claim 1 further comprising a dielectric capping layer located atop said dielectric material and said noble metal cap.

5. The interconnect structure of claim 1 further comprising a diffusion barrier located between the dielectric material and said at least one conductive material, said diffusion barrier having an upper surface that is coplanar with the upper surface of the at least one conductive material and said hydrophobic surface layer.

6. The interconnect structure of claim 5 wherein said diffusion barrier is U-shaped.

7. The interconnect structure of claim 1 wherein said hydrophobic surface layer has a depth, as measured from a top surface of the dielectric material into an interior portion of the dielectric material of about 2 nm or less.

8. The interconnect structure of claim 1 wherein said depth is from about 1 nm to about 0.2 nm.

9. The interconnect structure of claim 1 wherein said hydrophobic surface layer is a hydrogen treated surface portion of said dielectric material.

10. The interconnect structure of claim 1 wherein said dielectric material is porous and has a dielectric constant of about 3.0 or less.

11. An interconnect structure comprising:

a dielectric material having a dielectric constant of about 3.0 or less, said dielectric material having a hydrophobic surface layer and at least one Cu-containing conductive material having an upper surface embedded within said dielectric material, wherein the upper surface of said at least one Cu-containing conductive material is coplanar with an upper surface of said hydrophobic surface layer of said dielectric material; and a Ru-containing noble metal cap located directly on said upper surface of said at least one Cu-containing conductive material, said Ru-containing noble metal cap does not substantially extend onto said hydrophobic surface layer of said dielectric material that is adjacent to said at least one Cu-containing conductive material and no Ru-containing noble metal residues are present on the hydrophobic surface layer of said dielectric material.

12. The interconnect structure of claim 11 wherein an upper surface of said at least one Cu-containing conductive material is substantially coplanar with said hydrophobic surface layer of said dielectric material.

13. The interconnect structure of claim 11 further comprising a dielectric capping layer located atop said dielectric material and said noble metal cap.

14. The interconnect structure of claim 11 further comprising a diffusion barrier located between the dielectric material and said at least one conductive material, said diffusion barrier having an upper surface that is coplanar with the upper surface of the at least one conductive material and said hydrophobic surface layer.

15. The interconnect structure of claim 14 wherein said diffusion barrier is U-shaped.

16. The interconnect structure of claim 11 wherein said hydrophobic surface layer has a depth, as measured from a top surface of the dielectric material into an interior portion of the dielectric material of about 2 nm or less.

17. The interconnect structure of claim 11 wherein said depth is from about 1 nm to about 0.2 nm.

18. The interconnect structure of claim 11 wherein said hydrophobic surface layer is a hydrogen treated surface portion of said dielectric material.

19. The interconnect structure of claim 11 wherein said dielectric material is porous and has a dielectric constant of about 3.0 or less.

20. The interconnect structure of claim 11 wherein said upper surface of the at least one conductive material is non-recessed relative to the hydrophobic surface layer.

* * * * *